(12) United States Patent
Chen et al.

(10) Patent No.: US 10,487,922 B2
(45) Date of Patent: Nov. 26, 2019

(54) HORIZONTAL MOTION MECHANISM IN LIMITED SPACE

(71) Applicant: QUANTA COMPUTER INC., Taoyuan (TW)

(72) Inventors: Chao-Jung Chen, Taoyuan (TW); Chih-Hsiang Lee, Taoyuan (TW); Chih-Wei Lin, Taoyuan (TW); Chia-Wei Huang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/918,247

(22) Filed: Mar. 12, 2018

(65) Prior Publication Data

US 2019/0186603 A1 Jun. 20, 2019

Related U.S. Application Data

(60) Provisional application No. 62/607,169, filed on Dec. 18, 2017.

(51) Int. Cl.
| | | |
|---|---|---|
| *F16H 19/04* | (2006.01) | |
| *H05K 7/18* | (2006.01) | |
| *H05K 7/14* | (2006.01) | |
| *H05K 5/02* | (2006.01) | |
| *G06F 1/18* | (2006.01) | |

(52) U.S. Cl.
CPC ............ *F16H 19/04* (2013.01); *G06F 1/183* (2013.01); *H05K 5/023* (2013.01); *H05K 7/14* (2013.01); *H05K 7/18* (2013.01)

(58) Field of Classification Search
CPC .......... F16H 19/04; H05K 5/023; H05K 7/14; H05K 7/18

USPC ........................................................ 174/541
See application file for complete search history.

(56) References Cited

U.S. PATENT DOCUMENTS

| | | | | |
|---|---|---|---|---|
| 5,010,426 | A | 4/1991 | Krenz | |
| 5,399,156 | A * | 3/1995 | Lindsay | ............. A61M 1/3627 |
| | | | | 604/319 |
| 5,721,669 | A | 2/1998 | Becker et al. | |
| 9,826,658 | B1 * | 11/2017 | Mao | ..................... H05K 7/1487 |
| 2005/0198655 | A1 * | 9/2005 | Jung | .................... G11B 17/056 |
| | | | | 720/607 |

FOREIGN PATENT DOCUMENTS

TW    I612863 B    1/2018

OTHER PUBLICATIONS

Taiwanese Office Action for Application No. 107117801, dated Jul. 17, 2018, w/ First Office Action Summary.
(Continued)

*Primary Examiner* — Timothy J Thompson
*Assistant Examiner* — Charles Pizzuto
(74) *Attorney, Agent, or Firm* — Nixon Peabody LLP; Zhou Lu

(57) ABSTRACT

A method and apparatus are described for moving a tray within a confined space while the tray is bounded by a chassis. The movement of the tray is effected by a driven gear moving along a rack. A driving gear for rotating the driven gear is mounted on a handle or integral with a rotatable handle. The handle is rotatable about a pivot mounted on the chassis to provide the driving force to move the driven gear along the rack.

18 Claims, 5 Drawing Sheets

(56) References Cited

OTHER PUBLICATIONS

Taiwanese Search Report for Application No. 107117801, dated Jul. 17, 2018.
Extended European Search Report for EP Application No. 18183943.2, dated Jan. 24, 2019.

* cited by examiner

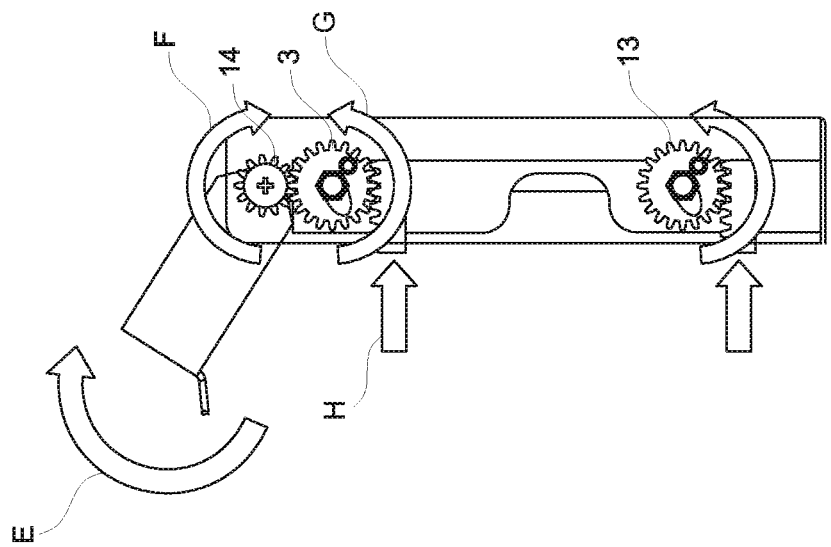
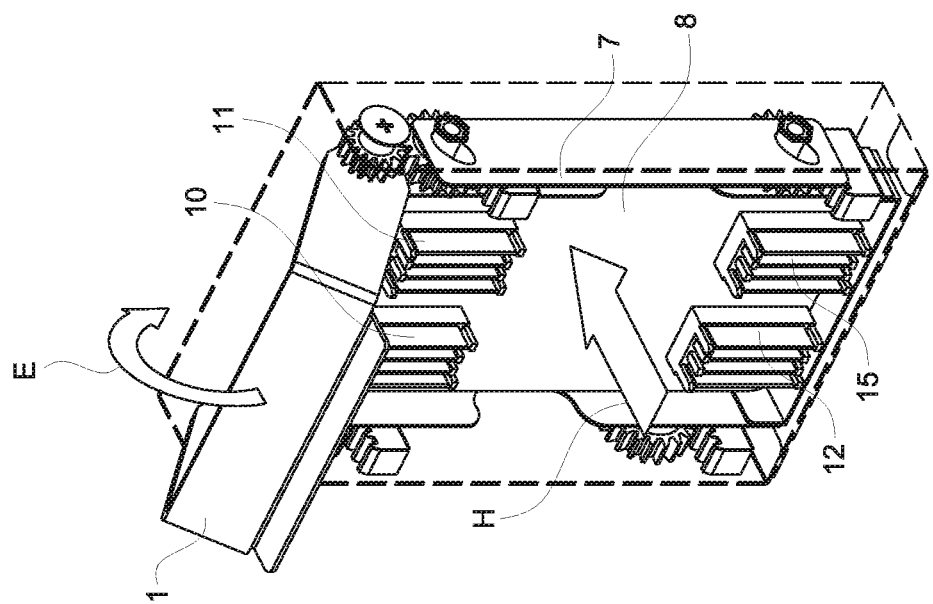
FIG. 3A
FIG. 3B

HORIZONTAL MOTION MECHANISM IN LIMITED SPACE

CROSS REFERENCE TO RELATED APPLICATIONS

This application claims benefit under 35 U.S.C. § 119 of U.S. Provisional patent application Ser. No. 62/607,169 filed on Dec. 18, 2017, the entire contents of which are herein incorporated by reference.

TECHNICAL FIELD

A mechanism to move a platform in a horizontal direction when there is limited space for motion is disclosed. The platform may carry any of numerous electrical devices or components, such as switches, connectors, fuses, contacts and other electrical devices or components by virtue of horizontal motion in a limited space for motion. The motion is effected through one or more racks which are fixed to a chassis. Gears which are equal in number to the number of racks are rotatable in relation to the racks, so as to cause movement of a platform carrying the electrical devices or components. The gears can be driven by rotation of a handle which imparts rotary motion to the gears.

BACKGROUND

There are many instances where it is required to impart horizontal motion. However, there is insufficient space to impart a uniform horizontal motion to a platform carrying a plurality of electrical devices or components, in which devices or components must be moved in unison. Not only must the movement of such devices be in unison, but the force required in the movement must be sufficient to cause an electrical effect that is simultaneous, or nearly so for each device or component. This would be the case where a plurality of contacts must be actuated simultaneously. This would also be the case where a plurality of electrical connectors must be brought into contact at the same time.

Heretofore, electrical solenoids, electric motors, or other electrically powered devices have been employed to effect horizontal motion. However, where space is limited, the use of these electrically powered devices are precluded. It would be of benefit if the same type of actuation achieved through an electrically powered device, could be achieved manually with the same efficiency.

SUMMARY

The present disclosure provides for a manually operated device where rotational motion imparted to a handle can be translated into linear, horizontal motion.

In one embodiment, a platform is used to mount a plurality of electrical devices or components, such as connectors, switches, contacts, fuses, and other electrical devices or components. For ease of explanation, the remaining disclosure will refer to these electrical devices or components as connectors.

In another embodiment, the plurality of connectors mounted on the platform are moveable relative to a chassis. The chassis is provided with a plurality of racks fixed upon the chassis. A number of first gears, equal in number to the number of racks, are rotatably mounted on the platform in a position to each mesh with a respective rack. A U-shaped handle is pivotably mounted to the chassis. A pair of second gears are fixedly mounted to each end of the U-shaped handle in a position to mesh with the first gears, such that upon rotation of the handle about the pivot, the second gears will mesh with and drive the first gears in a direction or rotation opposite to the direction of rotation of the handle. The first gears will in turn impinge upon its respective rack and move the platform in a linear, horizontal direction causing each of the connectors to move in unison. The first gear is also known as the output gear or driven gear. The second gear is also known as the input gear or drive gear.

In a further embodiment, the plurality of connectors mounted on the platform will move horizontally in unison, and be urged by the rotation movement of the U-shaped handle with a force greater than the force being applied to rotate the U-shaped handle.

These and other embodiments will be better understood when read in conjunction with the detailed description and the appended drawings.

BRIEF DESCRIPTION OF THE DRAWINGS

FIG. 3A is a perspective, schematic view similar to FIG. 1 illustrating the horizontal, retraction movement of the platform, and the plurality of connectors when the handle is rotated in a second direction.

FIG. 3B is a schematic, right side view of FIG. 3A, illustrating the horizontal, retraction movement of the platform and the plurality of connectors, and the direction of rotation of the first and second gears when the handle is rotated in a second direction.

DETAILED DESCRIPTION

Figure 1A:
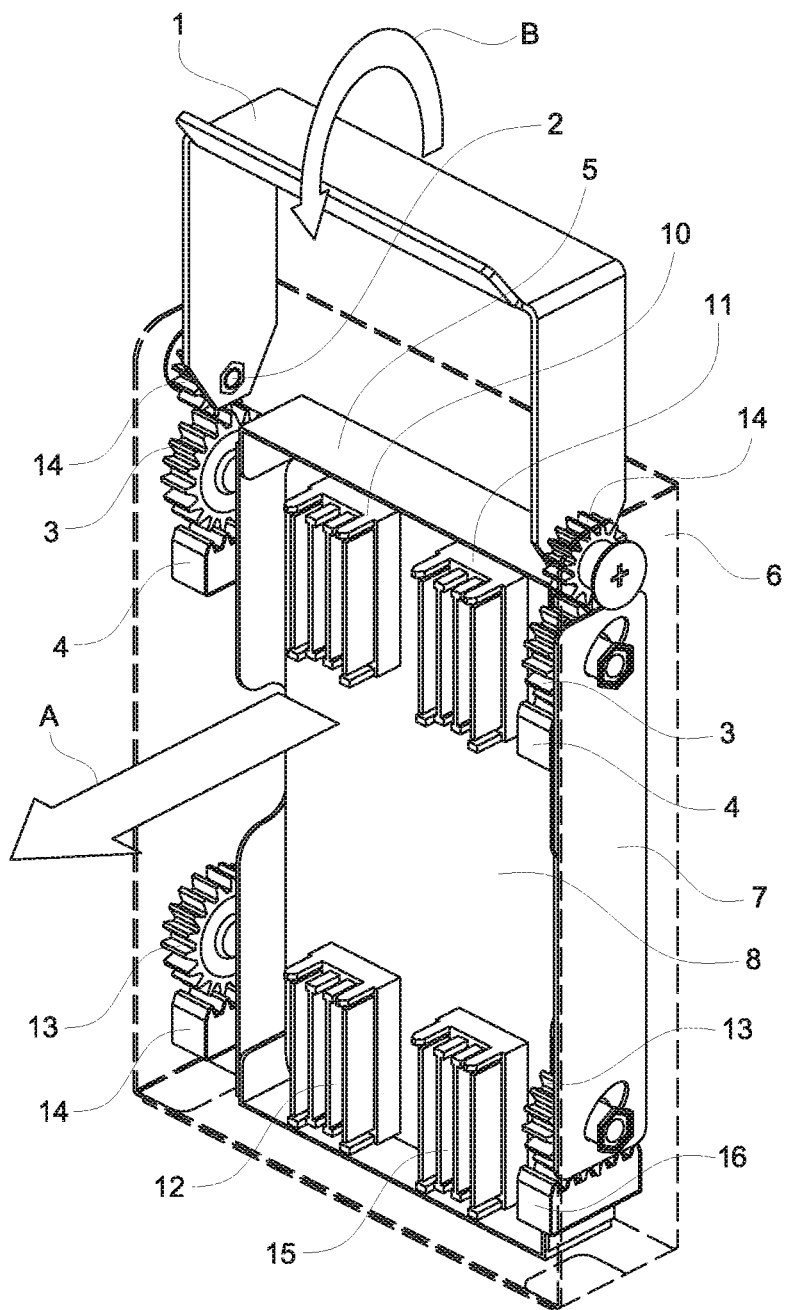
FIG. 1 is a perspective, schematic view of the mechanism for imparting horizontal motion to a plurality of connectors from rotational movement of a U-shaped handle.

The present invention is described with reference to the attached figures, wherein like reference numerals are used throughout the figures to designate similar or equivalent elements. The figures are not drawn to scale, and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As shown in FIG. 1, a rotating U-shaped handle 1 is pivotably attached at pivot 2 to chassis 6. Chassis 6 has a longitudinal axis and a transverse axis. Usually, the longitudinal axis of chassis 6 will be greater in length than the length of transverse axis of chassis 6. A tray 5 carries a plurality of electrical components, in particular a plurality of connectors 10, 11, 12 and 15, attached to floor 8 of tray 5. It is desired to move the connectors 10, 11, 12 and 15 in a horizontal direction shown by arrow A, orthogonal to both the longitudinal and transverse axes of the chassis 6. In order to achieve this horizontal motion, handle 1 is rotated in a first direction shown by arrow B. This rotation pivots the handle 1 about pivot 2. A first gear 3, which is mounted to chassis 6, moves along rack 4 as first gear 3 is rotated. Thus, the first gear 3 can operate as a pinion in relative movement with regard to the rack 4. Thus, the first gear 3 may move the rack 4 or may translate along the rack 4. The rotation of first gear 3 is caused by the opposite rotation of a second gear 14 which engages the first gear 3. The term "engages" is used in its ordinary sense, such as teeth on the second gear 14 engaging or mesh with teeth on the first gear 3. This engagement causes driving of the first (output) gear 3 by rotation of the second (input) gear 14.

The rotation of second gear 14 with respect to first gear 3 can be better understood in connection with FIGS. 2A and 2B, and FIGS. 3A and 3B. As handle 1 is rotated about arrow B, second gear 14 moves in the same direction as handle 1. This rotation of second gear 14 is counterclockwise as shown in the direction of arrow C in FIG. 2B. This counterclockwise movement of second gear 14 causes first gear 3 to moves in a clockwise direction illustrated by arrow D. The clockwise movement of first gear 3 causes the first gear 3 to traverse along rack 4 causing the tray 5, carrying the plurality of connectors 10, 11, 12 and 15, to move horizontally as shown by arrow A in FIG. 2B. Rack 4, being fixedly mounted in a horizontal position as illustrated in the FIGS. 1, 2A, 2B, 3A, and 3B, causes the movement of first gear 3 and tray 5, to which first gear 3 is mounted to move in a horizontal direction. The connectors 10, 11, 12, and 15, mounted on floor 8 of tray 5, move horizontally as well.

Reversing the rotation of handle 1, as shown by arrow E in FIGS. 3A and 3B, causes second gear 14 to rotate in a clockwise direction, as shown by arrow F in FIG. 3B. This clockwise rotation of second gear 14 causes first gear 3 to move in a counterclockwise direction, as shown by arrow G in FIG. 3B. This counterclockwise direction of movement of first gear 3 causes the first gear 3 to traverse along rack 4, causing a horizontal retraction of tray 5 in the direction of arrow H. This can be observed by comparing the position of driven gear 3 on rack 4 of FIG. 2A, with the same relative position of these same elements in FIG. 3A. The horizontal retraction of tray 5 also causes connectors 10, 11, 12, and 15 to move in the same direction along arrow H of FIG. 3B.

While we have described the movement of a single first gear 3 along a track 4, it is readily apparent that the provision of multiple first gears and tracks may stabilize the movement of tray 5 in chassis 6. Thus, the provision of a mirror image of first gear 3 and track 4 at the opposite end of a U-shaped handle 1 facilitates the stabilization of horizontal movement.

Figure 2B:
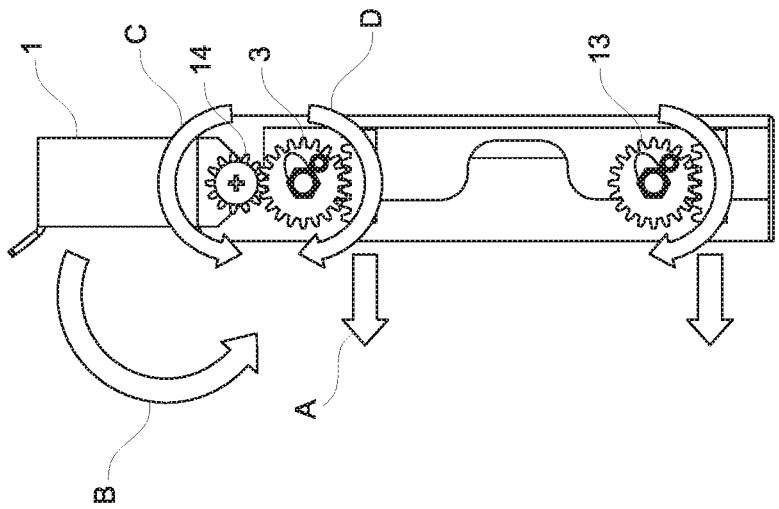
FIG. 2B is a schematic, right side view of FIG. 2A, illustrating the horizontal movement of the platform, and the plurality of connectors and the direction of rotation of the first and second gears when the handle is rotated in a first direction.
Figure 2A:
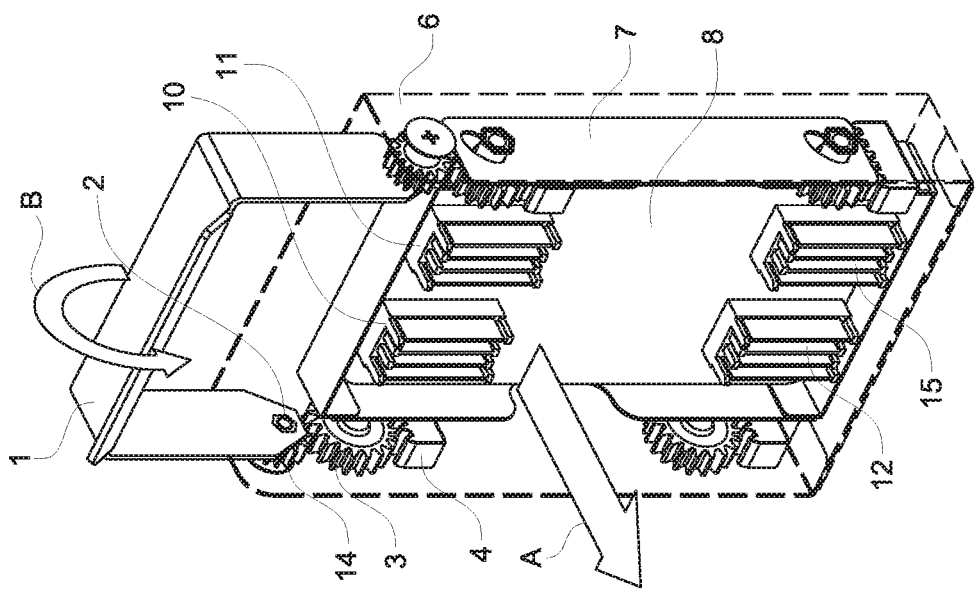
FIG. 2A is a perspective, schematic view similar to FIG. 1 illustrating the horizontal movement of the platform and the plurality of connectors when the handle is rotated in a first direction.

It will also stabilize the movement of tray 5, relative to chassis 6, to have a second (or even a third set—not shown) of gears 13 and tracks 16 as shown. In such a case, gears 13 will move on tracks 16, as shown in FIGS. 2B and 3B, but there will be no driving second gear in connection with gears 13. Rather gears 13 will follow the tracks 16, as influenced by the movement of transfer bar 7 under the influence of driven first gears 3.

While second gear 14 is illustrated as a separate element, it should be understood that second gear 14 may be made integral with handle 1. It should also be understood that the provision of a second gear 14 could be dispensed with entirely by providing the end of handle 1 with a gear like configuration of teeth, such that rotation of handle 1 directly drives and rotates first gear 3 without the need for a second gear 14. Furthermore, it should be understood that a mechanical advantage may be obtained by suitable configuring the relative sizes of first gear 3 and second gear 14 so as to achieve the desired mechanical advantage. It should be further understood that suitable configuring of the relative sizes of first gear 3 and second gear 14, and the number of teeth on each of the first gear 3 and second gear 14, could achieve an increase in the relative horizontal movement of first gear 3 upon rack 4, with a reduction of the degree of rotation of handle 1.

It should also be understood that although we have exemplified the handle 1 as a U-shaped handle, it may comprise other shapes without detracting from its ability to translate rotational movement into horizontal movement. Thus, the handle 1 may be L-shaped or may be linear in shape, so long as it is capable of pivotal movement and driving of first gear 3.

It should also be understood that horizontal movement can be a relative term depending on the orientation of the chassis. Thus, if mounted in other orientations, the movement of the tray relative to the chassis may be vertical, in an upwards or downwards direction.

Figure 4:
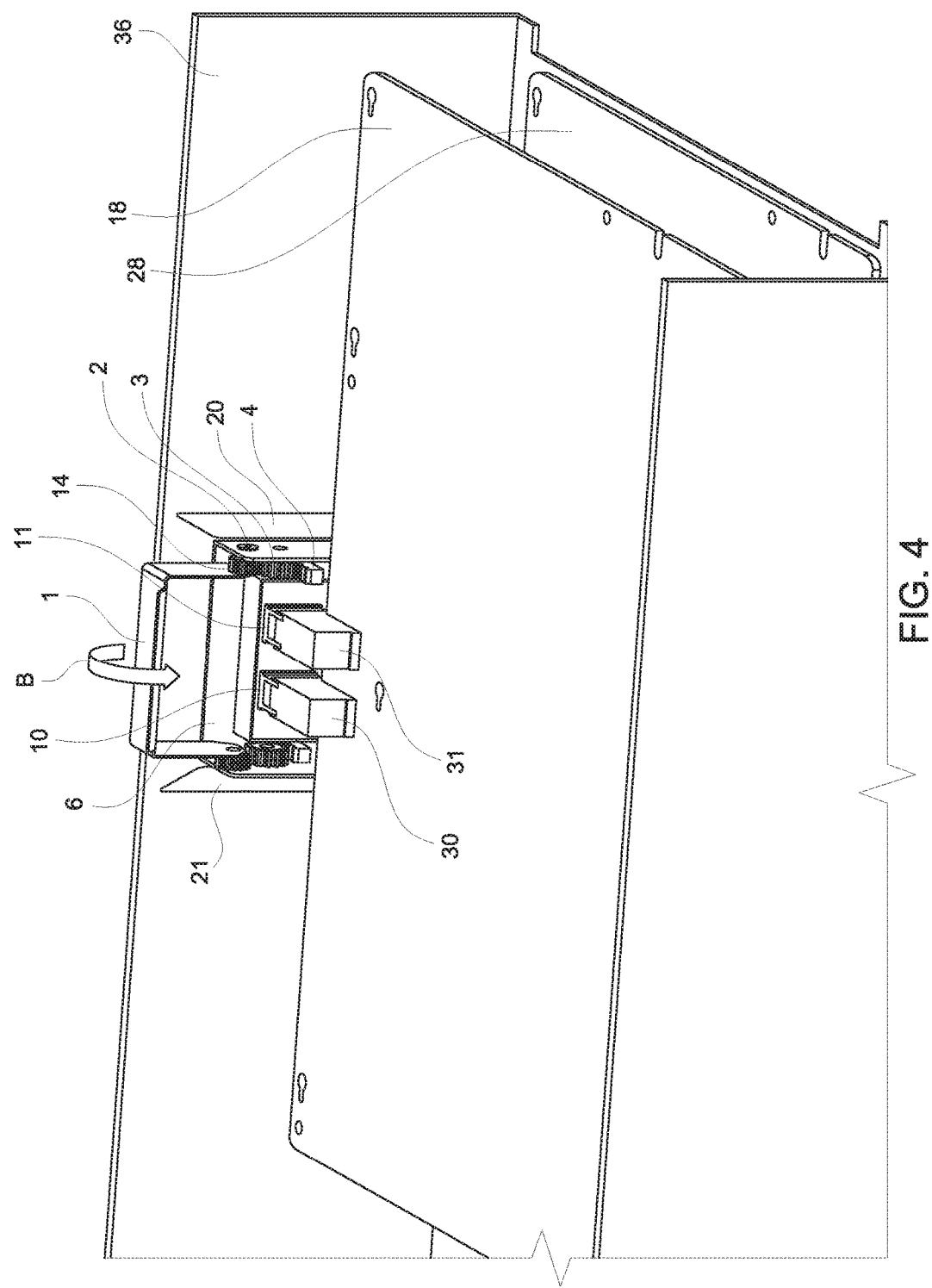
FIG. 4 is a schematic, perspective view of a mechanism for imparting horizontal motion to multiple trays contained within a chassis, where the trays are each provided with multiple connectors.
Figure 5:
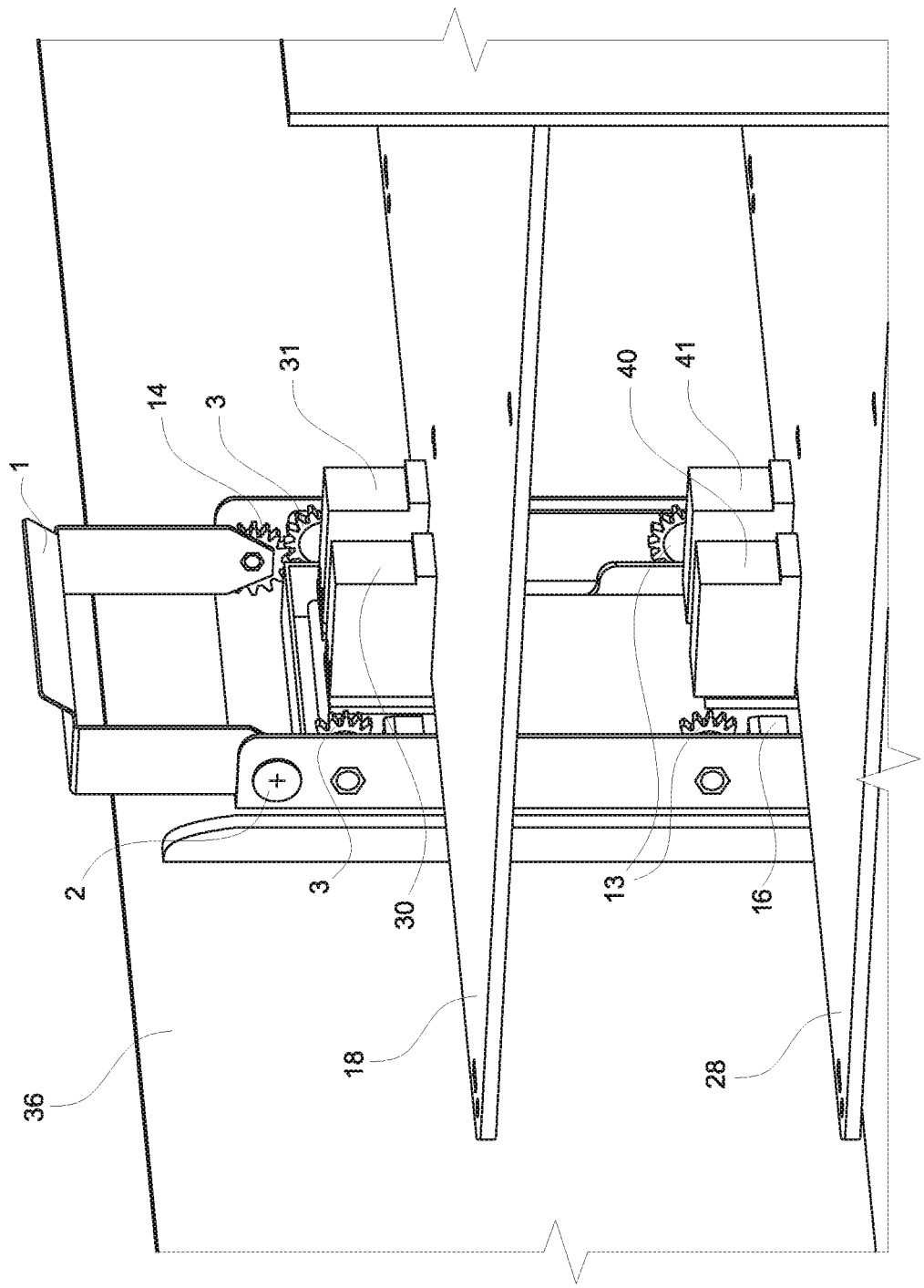
FIG. 5 is a schematic, side view of the mechanism of FIG. 4.

As shown in FIG. 4, multiple trays 18, 28 may be contained within an enclosure 36. Chassis 6 is mounted upon flanges 20, 21 of enclosure 36. In FIGS. 4 and 5, the trays 18, 28 are each are provided with multiple connectors, such as connectors 30, 31 in FIG. 4 and connectors 40, 41 in FIG. 5. In such an environment, the mechanism to convert the rotational movement of handle 1 into horizontal motion is basically the same as previously disclosed. Handle 1 is pivotably mounted on pivot 2 which is mounted on chassis 6, where flanges 20, 21 are affixed to enclosure 36. Flanges 20, 21 are fixed with enclosure 36 which function is guiding chassis 6. When handle 1 rotates in the direction of arrow B, it causes the second gear 14 to rotate. Rotation of second gear 14 causes first gear 3 to act as a pinion with rack 4 to move connectors 10 and 11 in a horizontal direction. In this embodiment, movement of connectors 10 and 11 would bring them into contact with connectors 30, 31, respectively. As shown in FIG. 5, lower tray 28 has connectors 40, 41, and movement of the handle 1 would also move connectors 12, 15 of FIG. 1 (not illustrated in FIG. 5) into contact with these connectors 40, 41, respectively. The movement of all connectors 10, 11, 12 and 15 is in unison. The contact of connectors 10, 11, 12 and 15 with their respective connectors 30, 31, 40, 41, respectively occurs simultaneously. Each of connectors 10, 11, 12, 15, 30, 31, 40 and 41 could be male and female connectors, touch connectors, pin and socket connectors, or other type of connectors known in the art.

It is to be understood that the various embodiments described herein are exemplary only, and not limiting, as those skilled in the art to which this specification is directed, will, upon reading this disclosure, envision other modifications and embodiments to implement the teachings of this disclosure.

The terminology used herein is for the purpose of describing particular embodiments only and is not intended to be limiting of the invention. As used herein, the singular forms "a", "an", and "the" are intended to include the plural forms as well, unless the context clearly indicates otherwise. Furthermore, to the extent that the term "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized way or overly formal sense unless expressly so defined herein.

We claim:

1. A mechanism for horizontally moving a tray confined within a chassis comprising:
   a chassis;
   a moveable tray confined within said chassis, the moveable tray containing a plurality of connectors; and,
   a rack and pinion mechanism for moving the tray and the plurality of connectors in a horizontal direction within said chassis,
   wherein the rack and pinion mechanism further comprises:
      a first gear being mounted upon said tray;
      a rack being mounted on the chassis;
      the first gear rotatably engaging the rack such that the first gear is capable of traversing the rack upon rotation of the first gear;
      a handle being pivotable mounted on the chassis; and
      a second gear mounted upon the handle, the second gear engaging the first gear and capable of driving the first gear upon rotation of the handle;
      wherein rotation of the handle about the pivot causes the tray to move in the horizontal direction.

2. The mechanism of claim 1, wherein the handle is U-shaped.

3. The mechanism of claim 1, wherein the first gear is mounted so as to rotate in a direction opposite to a direction of rotation of the second gear.

4. The mechanism of claim 1, wherein the second gear is integral with the handle.

5. The mechanism of claim 1, wherein the second gear is a separate element from the handle.

6. The mechanism of claim 1, wherein there are a plurality of first gears and a plurality of racks.

7. The mechanism of claim 1, wherein there are a plurality of racks for moving the tray.

8. The mechanism of claim 1, further comprising a mirror image of the first gear and the second gear, wherein the second gears are at ends of a U-shaped handle.

9. The mechanism of claim 1, further comprising a further set of racks mounted to the tray and a further set of gears mounted for translation along said further set of racks.

10. The mechanism of claim 9, further comprising a transfer bar between said first gear and said further set of gears.

11. The mechanism of claim 9, wherein said further set of gears mounted for translation along said further set of racks are driven solely by movement of the transfer bar.

12. The mechanism of claim 1, wherein the tray carries at least four connectors, and the four connectors are moved in unison.

13. A method of moving a tray in a confined space within a chassis, the method comprising:
   providing a chassis;
   providing at least one tray moveable with regard to said chassis while the tray is confined within said chassis;
   mounting a handle pivotable on a pivot mounted to the chassis;
   moving the at least one tray by providing a driven gear;
   providing a rack for each driven gear, wherein the driven gear translates along said rack during rotation of the driven gear;
   providing a driving gear, the driving gear comprising a plurality of teeth which mesh with teeth on the driven gear;
   rotating the driving gear by mounting the driving gear on a lower end of a handle; and,
   rotating said handle to rotate the driving gear.

14. The method of claim 13, wherein a direction of movement of the tray relative to the chassis is horizontal.

15. The method of claim 13, wherein the tray carries a plurality of electrical connectors thereon, and a direction of movement of the connectors relative to the chassis is horizontal.

16. The method of claim 15, wherein the connectors are all moved in unison.

17. The method of claim 16, wherein movement of the connectors brings each connector into contact with a respective connector simultaneously.

18. A mechanism for horizontally moving a tray confined within a limited space in a chassis comprising:
   a chassis;
   a moveable tray confined within said chassis, the moveable tray containing a plurality of connectors; and,
   a pair of rack and pinion mechanisms for moving the tray and the plurality of connectors in a horizontal direction within said chassis;
   wherein each pair of the rack and pinion mechanisms further comprises
   a first gear whereby the first gear is mounted upon said chassis; a rack, whereby the rack is mounted on the tray;
   wherein the first gear rotatably engaging its respective rack such that the first gear is capable of traversing its respective rack upon rotation of the first gear of each pair of the rack and pinion mechanisms;
   a U-shaped handle, which handle is pivotably mounted on the chassis;
   a second gear mounted upon each end of the U-shaped handle; each second gear respectively engaging the first gear of each pair of the rack and pinion mechanism, and capable of driving the first gear upon rotation of the handle;
   whereby rotation of the U-shaped handle about the pivot causes the tray to move in a horizontal direction.

* * * * *